US012720976B2

(12) United States Patent
Templier et al.

(10) Patent No.: US 12,720,976 B2
(45) Date of Patent: Aug. 25, 2026

(54) IMAGE CAPTURE DEVICE AND METHOD OF MANUFACTURING SUCH A DEVICE

(71) Applicant: Commissariat à l'Énergie Atomique et aux Énergies Alternatives, Paris (FR)

(72) Inventors: François Templier, Grenoble Cedex (FR); Josep Segura Puchades, Grenoble Cedex (FR); Fabrice Casset, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 865 days.

(21) Appl. No.: 17/888,837

(22) Filed: Aug. 16, 2022

(65) Prior Publication Data

US 2023/0056511 A1 Feb. 23, 2023

(30) Foreign Application Priority Data

Aug. 19, 2021 (FR) ........................................ 2108774

(51) Int. Cl.

*H10K 59/13* (2023.01)
*H10K 59/00* (2023.01)
*H10K 59/35* (2023.01)

(52) U.S. Cl.

CPC ............. *H10K 59/13* (2023.02); *H10K 59/00* (2023.02); *H10K 59/35* (2023.02)

(58) Field of Classification Search

CPC . H01L 25/167; H01L 25/042; H01L 25/0753; H01L 25/065; H01L 25/0652; H01L 25/0655; H01L 25/0657; H01L 25/16; H01L 25/162; H01L 25/165; H01L 25/18; H10K 59/90; H10K 59/95; H10F 39/90; H10F 39/95

See application file for complete search history.

(56) References Cited

U.S. PATENT DOCUMENTS 10,659,963 B1 * 5/2020 Lamego ................ H04W 76/14
12,538,684 B2 * 1/2026 Yang .................... H10K 59/353

(Continued)

FOREIGN PATENT DOCUMENTS

WO WO 2020/199674 A1 10/2020

OTHER PUBLICATIONS

Preliminary Search Report for French Application No. 2108774, dated Jun. 2, 2022.

*Primary Examiner* — Steven B Gauthier
*Assistant Examiner* — E. Rhett Cheek
(74) *Attorney, Agent, or Firm* — Wolf, Greenfield & Sacks, P.C.

(57) ABSTRACT

A device including: a transfer substrate including electric connection elements; and a plurality of elementary chips bonded and electrically connected to the transfer substrate, each elementary chip including at least one photodetector and an electronic circuit for reading from the at least one photodetector, the device further including, associated with at least one elementary chip, an emission, capture, or actuation element external to the elementary chip, bonded and electrically connected to the transfer substrate, each elementary chip including an electronic circuit for controlling the emission, capture, or actuation element associated with the chip.

11 Claims, 7 Drawing Sheets

(56) References Cited

U.S. PATENT DOCUMENTS

| | | | | |
|---|---|---|---|---|
| 2016/0135740 | A1* | 5/2016 | Ghaffari | A61B 5/01 600/481 |
| 2018/0303359 | A1* | 10/2018 | O'Brien | H10F 77/413 |
| 2018/0357460 | A1* | 12/2018 | Smith | H01L 25/167 |
| 2020/0000206 | A1* | 1/2020 | Nichol | G01J 1/46 |
| 2020/0035151 | A1 | 1/2020 | Feng et al. | |
| 2020/0297215 | A1* | 9/2020 | Cho | A61B 5/7475 |
| 2021/0150178 | A1* | 5/2021 | Wang | G06V 40/1388 |
| 2021/0265323 | A1* | 8/2021 | Halbritter | H01L 25/0753 |
| 2022/0320217 | A1* | 10/2022 | Han | H10K 59/60 |
| 2023/0162992 | A1* | 5/2023 | Fukushima | H01L 24/24 257/773 |
| 2023/0268331 | A1* | 8/2023 | Park | G01S 7/4813 257/82 |
| 2025/0271896 | A1* | 8/2025 | Jumbe | A61B 5/0205 |

* cited by examiner

IMAGE CAPTURE DEVICE AND METHOD OF MANUFACTURING SUCH A DEVICE

CROSS REFERENCE TO RELATED APPLICATIONS

This application claims priority to French application number 2108774, filed Aug. 19, 2021. The contents of which is incorporated by reference in its entirety.

TECHNICAL BACKGROUND

The present disclosure generally concerns the field of image capture devices, and more particularly aims at an image capture device called combined, combining an optical capture function and a light emission function, and a method of manufacturing such a device. More generally, it concerns a combined image capture device combining an optical capture function and another function, for example an emission or actuation function or another capture function.

PRIOR ART

Image display devices comprising a plurality of elementary monolithic electronic chips arranged in an array on a same transfer substrate have already been provided, for example, in patent applications WO2017089676, EP3401958, and WO2018185433 previously filed by the applicant. The elementary chips are rigidly mounted on the transfer substrate and connected to electric connection elements of the transfer substrate for their control. Each chip comprises one or a plurality of light-emitting diodes (LEDs) and a circuit for controlling said one or a plurality of LEDs and corresponds to a pixel of the device. The control circuit comprises a connection surface opposite to said one or a plurality of LEDs, comprising a plurality of electric connection areas intended to be connected to the transfer substrate for the control of the microchip. The transfer substrate comprises a connection surface comprising, for each microchip, a plurality of electric connection areas intended to be respectively connected to the electric connection areas of the microchip. The chips are placed on the transfer substrate, with their connection surfaces facing the connection surface of the transfer substrate, and bonded to the transfer substrate to connect the electric connection areas of each microchip to the corresponding electric connection areas of the transfer substrate.

This type of display device is particularly adapted to form display screens of large surface area, for example, computer, television, tablet, etc. screens.

The forming of an interactive image display device comprising a light emission function and an optical capture function is here more particularly considered. More generally, the forming of a combined image capture device, combining an optical capture function and another function, for example, a light emission or actuation function, or another optical capture function, is here considered.

SUMMARY OF THE INVENTION

An embodiment provides a device comprising:

a transfer substrate comprising electric connection elements; and a plurality of elementary chips bonded and electrically connected to the transfer substrate, each elementary chip comprising at least one photodetector and an electronic circuit for reading from said at least one photodetector, the device further comprising, associated with at least one elementary chip, an emission, capture, or actuation element external to the elementary chip, bonded and electrically connected to the transfer substrate, each elementary chip comprising an electronic circuit for controlling the emission, capture, or actuation element associated with the chip.

According to an embodiment, in each elementary chip, the electronic circuit for reading from said at least one photodetector and the electronic circuit for controlling the emission, capture, or actuation element associated with the chip comprise MOS transistors formed inside and on top of a single-crystal silicon layer.

According to an embodiment, in each elementary chip, said at least one photodetector is an inorganic photodetector based on a III-V semiconductor material.

According to an embodiment, in each elementary chip, said at least one photodetector comprises an indium gallium arsenide absorption layer.

According to an embodiment, the emission, capture or actuation element comprises at least one light-emitting diode.

According to an embodiment, said at least one light-emitting diode is an organic light-emitting diode.

According to an embodiment, each emission, capture, or actuation element comprises three light-emitting diodes respectively defining three emission sub-pixels, and wherein each elementary chip comprises a plurality of control sub-circuits adapted to individually controlling respectively the three light-emitting diodes.

According to an embodiment, the three emission sub-pixels are adapted to respectively emitting in three different wavelength ranges.

According to an embodiment, in each elementary chip, the three control sub-circuits are coupled to a same input terminal of the chip, connected to a corresponding connection area of the transfer substrate, intended to sequentially receive emission instruction signals for the three light-emitting diodes.

According to an embodiment, the capture or actuation element associated with each elementary chip is a piezoelectric transducer.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Figure 1A:
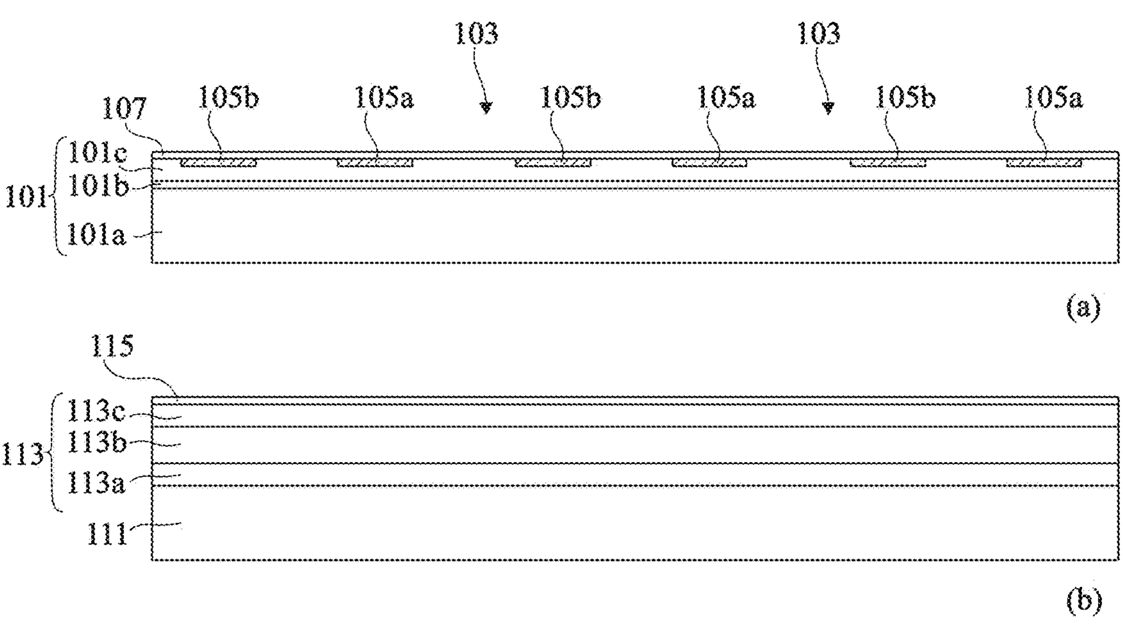
FIGS. 1A, 1B, 1C, 1D, 1E, IF, 1G, 1H, 1I, and 1J are cross-section views illustrating successive steps of an embodiment of a method of manufacturing elementary pixel chips of a combined image capture device according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various applications that the described combined image capture devices may have not been detailed, the described embodiment being compatible with all or most of the known applications of an optical capture device integrating an emissive display function, for example, applications of motion detection, face recognition, identification, etc., and more generally of an optical capture device integrating another function, for example, of emission, capture, or actuation.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms “front”, “back”, “top”, “bottom”, “left”, “right”, etc., or to relative positional qualifiers, such as the terms “above”, “below”, “upper”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%.

According to an aspect of an embodiment, an image capture device comprising a plurality of elementary monolithic electronic chips arranged in an array on a same transfer substrate is provided. As in the examples described in patent applications WO2017089676, EP3401958, and WO2018185433 previously filed by the applicant, the elementary chips are rigidly assembled to the transfer substrate and connected to electric connection elements of the transfer substrate. Each chip comprises one or a plurality of photodetectors (for example, photodiodes) and a circuit for controlling said one or a plurality of photodetectors and corresponds to a pixel of the capture device. The control circuit comprises a connection surface opposite to said at least one or a plurality of photodetectors, comprising a plurality of electric connection areas (also called terminals or pads) intended to be connected to the transfer substrate for the microchip control. The transfer substrate comprises a connection surface comprising, for each microchip, a plurality of electric connection areas (also called terminals or pads) intended to be respectively connected to the electric connection areas of the microchip. The chips are placed on the transfer substrate, with their connection surfaces facing the connection surface of the transfer substrate, and bonded to the transfer substrate to connect the electric connection areas of each microchip to the corresponding electric connection areas of the transfer substrate.

According to an aspect of an embodiment, the combined image capture device further comprises a light emission function, for example, an image display function. For this purpose, the device comprises a plurality of light-emitting diodes (LEDs), for example, organic LEDs, arranged in an array of rows and columns and defining an image display device. The LEDs are external to the elementary pixel chips of the combined capture device, and are arranged on the transfer substrate of the device, on the same side of the transfer substrate as the elementary pixel chips. The LEDs are connected to electronic connection terminals of the transfer substrate for their control. The LEDs may emit in the visible range or in infrared, or even simultaneously in the visible range and in infrared, in which case one of the emissions (preferably, the infrared one) is captured by the capture device.

As an example, the device comprises an elementary group of one or a plurality of LEDs per elementary pixel chip of the combined capture device, arranged in the vicinity of said elementary pixel chip. In other words, the array of elementary pixel chips of the capture device and the array of elementary groups of LEDs are interlaced arrays of same dimensions and of same pitch.

According to an aspect of an embodiment, each elementary pixel chip of the combined capture device integrates an electronic circuit for controlling the corresponding elementary group of one or a plurality of LEDs, that is, of same position (same coordinates) in the pixel array. Each elementary pixel chip of the device comprises, for each LED of the corresponding elementary group of one or a plurality of LEDs, a connection terminal individually connected to an electrode of the LED via a conductive track of the support substrate.

Examples of embodiment of such a combined image capture device will be described in further detail hereafter in relation with the drawings.

FIGS. 1A to 1J are cross-section views illustrating an example of a method of manufacturing elementary pixel chips of the device.

FIG. 1A comprises a view (a) schematically showing a control structure comprising a first substrate 101 inside and on top of which have been formed a plurality of elementary integrated control circuits 103, for example, identical or similar, respectively corresponding to the integrated control circuits of the future elementary pixel chips of the device.

In the shown example, substrate 101 is a substrate of SOI (“Semiconductor On Insulator”) type comprising a support semiconductor substrate 101*a*, for example, made of silicon, an insulating layer 101*b*, for example, made of silicon, arranged on top of and in contact with the upper surface of support substrate 101*a*, and an upper semiconductor layer 101*c*, for example, made of single-crystal silicon, arranged on top of and in contact with the upper surface of insulating layer 101*b*.

In this example, elementary control circuits 103 are formed inside and on top of the upper semiconductor layer 101*c* of substrate 101. Each elementary control circuit 103 for example comprises a plurality of MOS transistors (not detailed in FIGS. 1A to 1J). Elementary control circuits 103 are for example formed in CMOS technology (“Complementary Metal Oxide Semiconductor”). Each elementary control circuit 103 may comprise a circuit for reading from the photodetector of the future elementary pixel chip of the device, and a circuit adapted to controlling the light emission by the LED(s) associated with the future elementary pixel chip of the device.

In this example, each elementary control circuit 103 comprises, on its upper surface side, one or a plurality of metal connection pads 105*a*, 105*b*. As an example, pads 105*a*, 105*b* are flush with the upper surface side of an upper insulating layer, for example, made of silicon oxide, of an interconnection stack (not detailed in the drawings) coating the upper surface of the upper semiconductor layer 103*c* of substrate 101. Thus, in this example, the upper surface of the control structure is a planar surface comprising an alternation of metal regions (pads 105*a*, 105*b*) and of insulating regions.

As an example, each elementary control circuit 103 comprises a specific metal pad 105*a* for each photodetector of the future elementary pixel chip of the device, intended to be connected to a first terminal, for example, an anode terminal, of the photodetector, enabling to individually read an electric signal representative of a light radiation received by each photodetector. Each elementary control circuit 103 may further comprise a metal pad 105*b* intended to be connected to a second terminal, for example, a cathode terminal of each photodetector of the future elementary pixel chip of the device. In the case where the elementary chip comprises a plurality of photodetectors, the cathode contact may be common to all the photodetectors in the chip. Thus, elementary control circuit 103 may comprise a single metal pad 105*b*. As a variant, elementary control circuit 103 comprises a specific metal pad 105*b* per photodetector.

In the shown example, each elementary pixel chip of the device comprises a single photodetector, for example, adapted to mainly capturing infrared light. Thus, each elementary control circuit 103 comprises a single metal pad 105*a* and a single metal pad 105*b* intended to be connected respectively to the anode and cathode regions of the photodetector.

FIG. 1A further comprises a view (b) schematically showing a structure comprising a second substrate 111, having an active photosensitive diode stack 113 resting thereon.

Stack 113 is a stack of inorganic semiconductor layers. Stack 113 for example comprises one or a plurality of layers made of a III-V-type semiconductor material. Stack 113 is for example an active photodiode stack sensitive in infrared or near infrared. As a variant, stack 113 is an active photodiode stack sensitive in the visible range. As an example, stack 113 comprises, in the order from the upper surface of substrate 111, a layer 113*a* made of non-intentionally doped indium phosphide (InP), an absorption layer 113*b* made of indium gallium arsenide (InGaAs), for example, intrinsic or lightly N-type doped (for example, in the order of 1015 atoms/cm3), and a layer 113*c* made of N-type doped indium phosphide (InP). As an example, the N-type doping level of layer 113*c* is in the range from 1016 to 1018 atoms/cm3. In this example, layer 113*b* is in contact, by its lower surface, with the upper surface of layer 113*a*, and layer 113*c* is in contact, by its lower surface, with the upper surface of layer 113*b*.

Substrate 111 is for example made of indium phosphide. Layers 113*a*, 113*b*, and 113*c* may be successively formed by epitaxy on the upper surface of substrate 111. Substrate 111 then is a growth substrate. A buffer layer, not shown, for example, made of indium phosphide, may possibly form an interface between substrate 111 and layer 113*a*. Buffer layer is for example in contact, by its lower surface, with the upper surface of substrate 111, and by its upper surface, with the lower surface of layer 113*a*. Buffer layer may also be formed by epitaxy from the upper surface of substrate 111, before the forming of layers 113*a*, 113*b*, and 113*c*.

As a variant, rather than forming active photosensitive diode stack 113 by epitaxy on the upper surface of substrate 111, the active stack may be formed in the reverse order on a growth substrate, not shown, and then transferred and bonded onto substrate 111. In this case, layers 113*c*, 113*b*, and 113*a* are successively formed by epitaxy on a surface of the growth substrate. A buffer layer, for example made of indium phosphide, may possibly form an interface between the growth substrate and layer 113*c*. Stack 113 is then bonded to the upper surface of substrate 111, for example, by direct bonding or molecular bonding of the lower surface of layer 113*a* to the upper surface of substrate 111. The growth substrate and, possibly, the buffer layer forming an interface between the growth substrate and layer 113*c*, may then be removed to clear the access to the upper surface of layer 113*c*. In this variant, substrate 111 is a support substrate, for example, made of silicon, or of any other material adapted to being used as a support for receiving active stack 113.

At this stage, each of the layers of active photosensitive diode stack 113 extends, for example, continuously and with a substantially uniform thickness, over the entire upper surface of substrate 111.

FIG. 1A further illustrates a step of deposition of a dielectric layer 107, for example, made of silicon oxide, on top of and in contact with the upper surface of the control structure of view (a). In this example, layer 107 continuously extends with a substantially uniform thickness over the entire upper surface of the interconnection stack of the control structure of view (a).

FIG. 1A further illustrates a step of deposition of a dielectric layer 115, for example, made of the same material as layer 107, for example, of silicon oxide, on top of and in contact with the upper surface of the active photosensitive diode stack 113 of the structure of view (b). As an example, layer 115 is deposited on top of and in contact with the upper surface of layer 113*c*. Layer 115 for example extends continuously and with a substantially uniform thickness over the entire upper surface of stack 113.

Figure 1B:
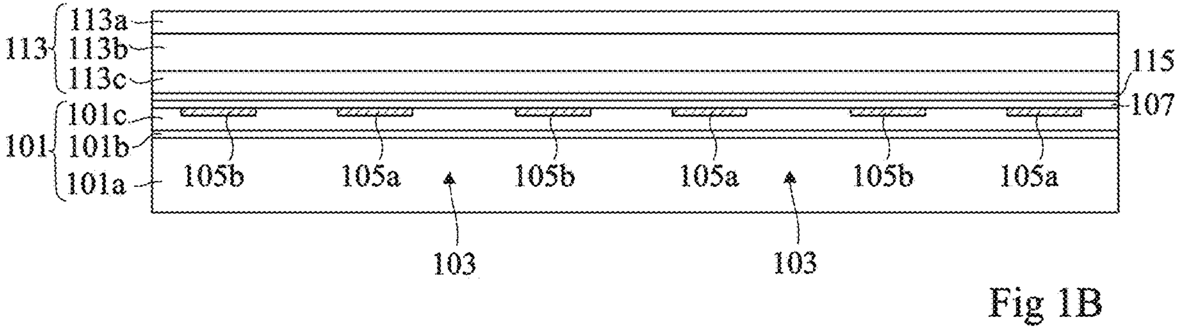

FIG. 1B illustrates the structure obtained at the end of a step of transfer and of bonding of active photosensitive diode stack 113 and of dielectric layer 115 onto the control structure of the view (a) of FIG. 1A.

In FIG. 1B, the orientation of the structure of view (a) of FIG. 1A remains unchanged. However, the elements of the structure of view (b) of FIG. 1A are inverted with respect to the orientation of FIG. 1A.

During this step, the structure of view (b) of FIG. 1A is transferred onto the upper surface of the structure of view (a) of FIG. 1A, by using substrate 111 as a handle. The lower surface (in the orientation of FIG. 1B, corresponding to the upper surface in the orientation of FIG. 1A) of dielectric layer 115 is bonded to the upper surface of dielectric layer 107. The bonding is for example obtained by direct bonding or molecular bonding of the lower surface of layer 115 to the upper surface of layer 107, that is, with no addition of material between the two layers.

Substrate 111 is then removed, for example, by grinding and/or chemical etching, to clear the access to the upper surface of active photosensitive diode stack 113, that is, in this example, the upper surface of semiconductor layer 113*a*.

Figure 1C:
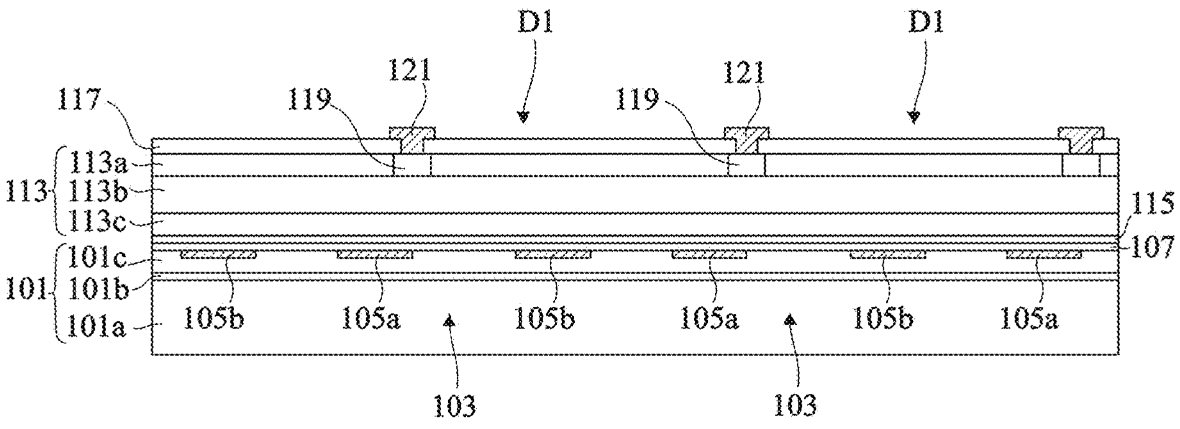

FIG. 1C illustrates the structure obtained at the end of the following successive steps: i) deposition of a dielectric layer 117, for example made of silicon nitride or of silicon oxide, on the upper surface of layer 113a, for example, in contact with the upper surface of layer 113a;

ii) forming of local through openings in dielectric layer 117, in front of future P-type contacting areas corresponding to anode regions of the photosensitive diodes of the device;

iii) P-type doping of local regions 119 of layer 113a, located in front of said through openings;

iv) forming of contacting metallizations 121 in the through openings, each metallization 121 individually contacting the underlying P-type doped region 119, through the corresponding opening.

At step i), dielectric layer 117 is for example deposited by a method of plasma-enhanced chemical vapor deposition (PECVD).

At step ii), the through openings formed in dielectric layer 117 are for example formed by photolithography and etching.

At step iii), the doping of regions 119 may be performed by diffusion or implantation of P-type dopant elements, for example, zinc (Zn) or beryllium (Be), in front of the openings formed at step ii). An activation anneal of the dopant elements may then be implemented. As an example, the activation anneal may be a surface laser anneal, which enables not to alter integrated circuits 103, nor to alter the quality of the bonding between integrated circuits 103 and active photosensitive diode stack 113. P-type doped regions 119 form anode regions of the photosensitive diodes of the device. In this example, regions 119 extend across the entire thickness of layer 113a, and come into contact, by their lower surface, with the upper surface of absorption layer 113b.

At step iv), as an example, a metal layer is first continuously deposited over the entire upper surface of the structure, that is, on top of and in contact with the upper surface of dielectric layer 117 and in the openings formed at step ii), and then removed by photolithography and etching while keeping metallizations 121. In this example, each metallization 121 forms an anode electrode of a photosensitive diode D1 of the device.

Figure 1D:
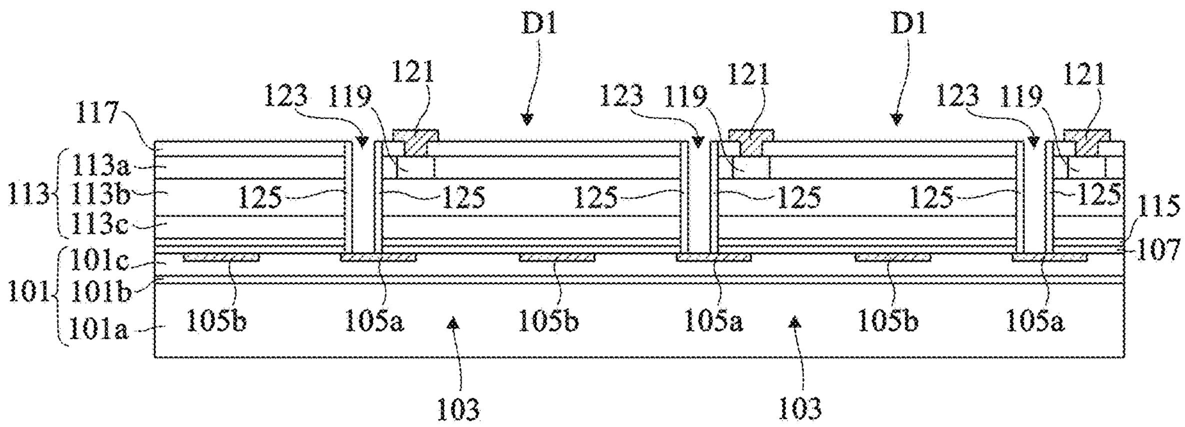

FIG. 1D illustrates the structure obtained at the end of a step of forming, from the upper surface of the structure, of first openings or contacting vias 123 crossing active photosensitive diode stack 113 and emerging onto anode connection pads 105a of the integrated control circuits 103. Openings 123 extend vertically from the upper surface of dielectric layer 117 to the upper surface of pads 105a, through layers 117, 113a, 113b, 113c, 115, and 107. Openings 123 for example have a circular shape (in top view, not shown). In this example, for each of photosensitive diodes D1, a specific opening 123 forming an anode contacting opening of the diode is formed at this step.

FIG. 1D further illustrates a step of deposition of an electrically-insulating layer 125, for example, made of silicon oxide, on the lateral walls of openings 123. Layer 125 is for example continuously deposited, by a conformal deposition method, over the entire upper surface of the structure after the forming of openings 123. The horizontal portions of layer 125 are then removed by vertical anisotropic etching so that there only remain the vertical portions coating the lateral walls of openings 123. This particularly enables to clear the access to the upper surface of pads 105a at the bottom of openings 123.

Figure 1E:
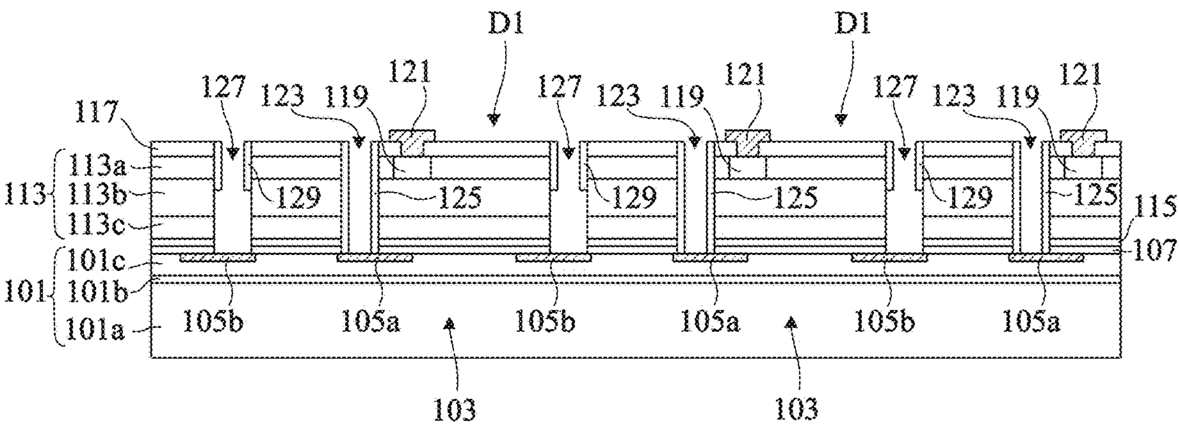

FIG. 1E illustrates the structure obtained at the end of a step of forming, from the upper surface of the structure, of second openings or contacting vias 127 crossing active photosensitive diode stack 113 and emerging onto cathode connection pads 105b of the integrated control circuits 103. Openings 127 extend vertically from the upper surface of dielectric layer 117 to the upper surface of pads 105b, through layers 117, 113a, 113b, 113c, 115, and 107. Openings 127 for example have a circular shape (in top view, not shown). In this example, for each of photosensitive diodes D1, a specific opening 127 forming a cathode contacting opening of the diode is formed at this step.

FIG. 1E further illustrates a step of deposition of an electrically-insulating layer 129, for example, made of silicon oxide, over an upper portion of the lateral walls of openings 127. In this example, layer 129 covers the sides of upper semiconductor layer 113a and an upper portion of the side of the intermediate semiconductor layer 113b of stack 113. Insulating layer 129 is for example deposited by sputtering, by using a substrate inclination and rotation system to deposit the insulating material only in the upper portion of openings 127. The deposition depth may be adjusted by varying the inclination of the substrate with respect to the sputtering direction. During the step of deposition of insulating layer 129, openings 123 are for example protected by means of a mask, not shown.

Figure 1F:
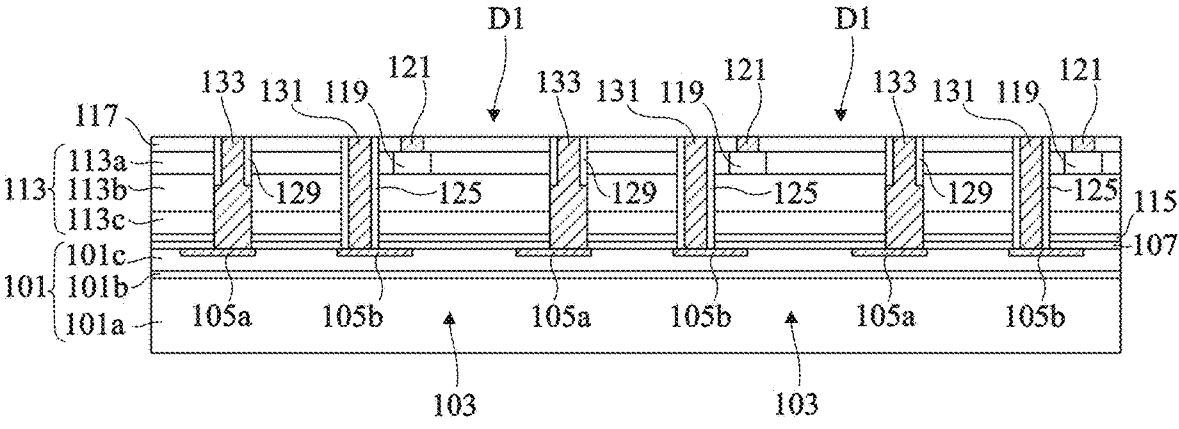

FIG. 1F illustrates a subsequent step of filling of openings 123 and 127 with metal, to form conductive vias 131, respectively 133. At the end of this step, a step of planarization of the upper surface of the structure, for example, a chemical-mechanical planarization (CMP), may be implemented, so that metallizations 121, 131, 133 are flush with the upper surface of dielectric layer 117.

In this example, the anode contacting vias 131 of diodes D1 are insulated from the layers of stack 113 by lateral insulation layer 125. The cathode contacting via 133 of diodes D1 are insulated from layer 113a by lateral insulation layer 129 and are in contact, laterally, with cathode layer 113c. Vias 133 electrically connects the cathode layer 113c of the photosensitive diode stack to the cathode connection pads 105b of photosensitive diodes D1. As a variant, upper lateral insulation layer 129 may be omitted. Indeed, since the layers 113b and 113a of stack 113 are little or non-doped, the lateral contact between via 133 and said layers 113b, 113c causes no short-circuit of diodes D1.

Figures 1G, 1H, 1I, 1J:
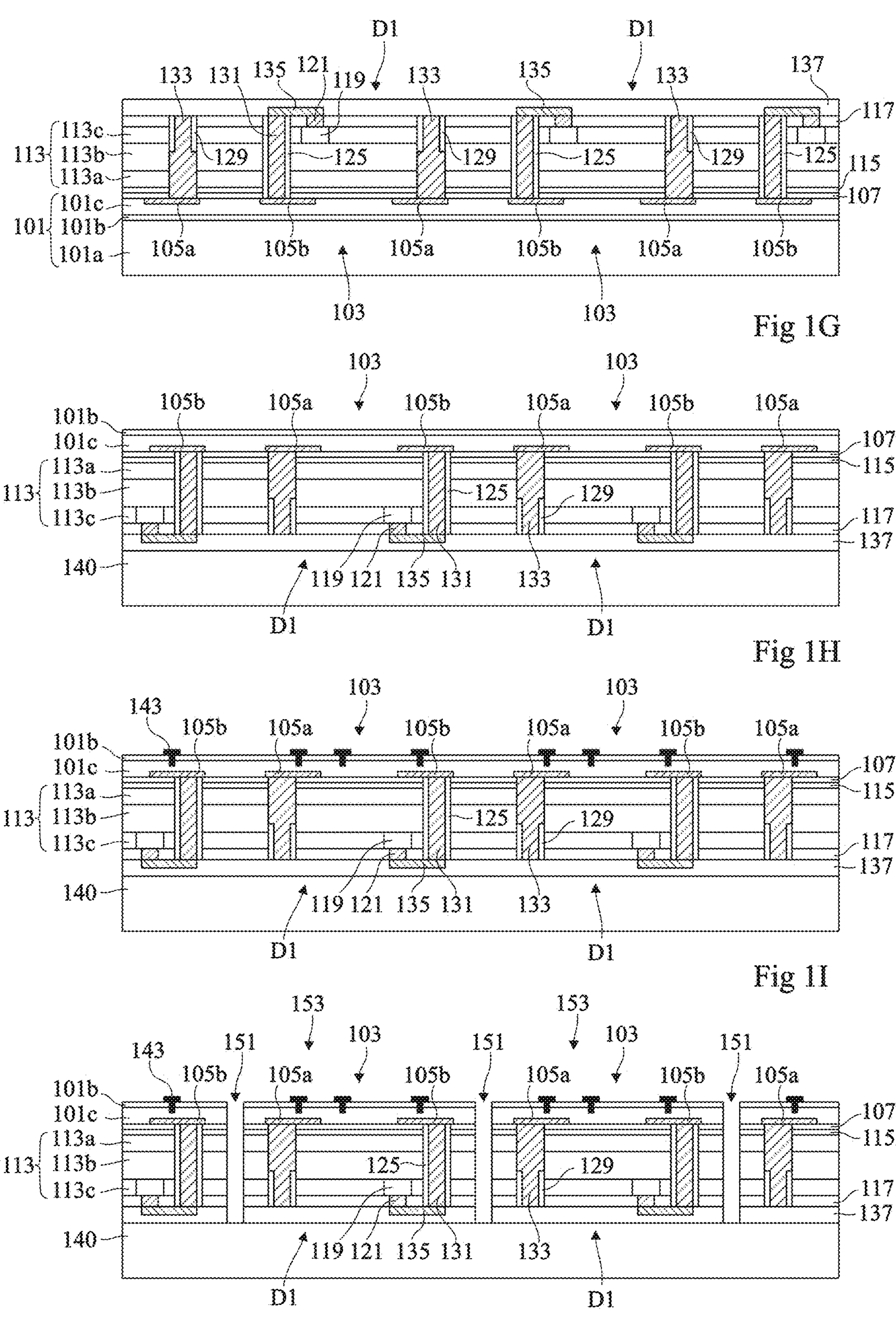

FIG. 1G illustrates the structure obtained at the end of a step of forming of metallizations on the upper surface of the structure of FIG. 1F. The metallizations formed at this step are in contact, by their lower surface, with the upper surface of dielectric layer 117 and with underlying metallizations 131 and 121.

At this step, there is for example formed, for each diode D1, a metallization 135 electrically connecting the anode contacting via 131 of diode D1 to the anode contact metallization 121 of this diode.

As an example, a metal layer is first continuously deposited over the entire upper surface of the structure of FIG. 1F, and then locally removed by photolithography and etching while keeping metallizations 135.

FIG. 1G further illustrates a subsequent optional step of forming of a passivation layer 137, for example, made of a dielectric material, for example, of silicon oxide, on the upper surface of the structure obtained at the end of the step of forming of metallizations 135. Layer 137 for example extends continuously over the entire upper surface of the structure. As an example, layer 137 has a substantially planar upper surface.

FIG. 1H illustrates a subsequent step of transfer of the structure of FIG. 1G onto a temporary support substrate 140. In FIG. 1H, the orientation of the structure is inverted with respect to the orientation of FIG. 1G. The temporary support substrate is bonded to the surface of passivation layer 137 opposite to substrate 101, that is, its lower surface in the orientation of FIG. 1H (corresponding to its upper surface in the orientation of FIG. 1G). Temporary support substrate 140 is for example a silicon substrate. The bonding of temporary support substrate 140 to layer 137 may be obtained by means of an adhesive bonding layer, or by direct bonding.

FIG. 1H further illustrates a subsequent step of removal of support substrate 101*a* from the initial SOI structure, for example, by grinding and/or chemical etching, to clear the access to the upper surface of the insulating layer 101*b* of the SOI structure.

It should be noted that the described embodiments are not limited to the above-described example where substrate 101 is an SOI-type substrate. As a variant, substrate 101 may be solid semiconductor substrate, for example, made of silicon. In this case, at the step of FIG. 1A, substrate 101 may be thinned from its rear surface (upper surface in the orientation of FIG. 1H), for example, by grinding. An insulating passivation layer, for example, made of silicon oxide, may then be deposited on the upper surface of the thinned substrate, replacing the layer 101*b* of the SOI substrate. As a variation, layer 101*b* may be omitted or removed.

FIG. 1I illustrates the structure obtained at the end of steps of forming of contacting openings in layers 101*b* and 101*c*, and of forming of contacting metallizations 143 inside and on top of said openings. Metallizations 143 enable to take electric contacts on metal levels (not detailed in the drawings) of the interconnection stack arranged on the lower surface side of semiconductor layer 101*c*. Metallizations 131 are for example electrically connected to transistors of the control circuit, these transistors being themselves connected or electrically coupled to connection metallizations 105*a*, 105*b* of diodes D1.

Metallizations 143 form connection terminals of the future elementary pixel chips of the device, intended to be connected to corresponding connection terminals of the transfer substrate of the device.

FIG. 1J illustrates the structure obtained at the end of a step of singulation of the elementary pixel chips of the device. For this purpose, trenches 151 extending vertically, through layers 101*b*, 101*c*, 107, 115, 113*a*, 113*b*, 113*c*, 117, and 137 are formed from the upper surface of the structure, along cutting lines. In this example, the trenches emerge onto the upper surface of temporary support substrate 140. In top view, trenches 151 form a continuous gate laterally delimiting a plurality of elementary pixel chips 153, for example, identical or similar, each comprising an elementary control circuit 103 and one or a plurality of photosensitive diodes D1 (a single diode D1 in the shown example). Trenches 151 are for example formed by plasma etching.

As a variant, not shown, optical filter forming steps may be provided, for example, after the deposition of passivation layer 137 and before the bonding of temporary support substrate 140. Thus, each photosensitive diode D1 may be coated, on the side of its surface of exposure to light, that is, its lower surface in the orientation of FIG. 1J, with an optical filter, for example, a bandpass filter, enabling to filter the radiation illuminating diode D1. The forming of such optical filters is within the abilities of those skilled in the art on reading of the present disclosure.

Elementary pixel chips 153 are intended to be transferred onto a transfer substrate 200 of the capture device, as will be described in further detail hereafter in relation with FIGS. 3A to 3D.

Figures 2, 3A, 3B:
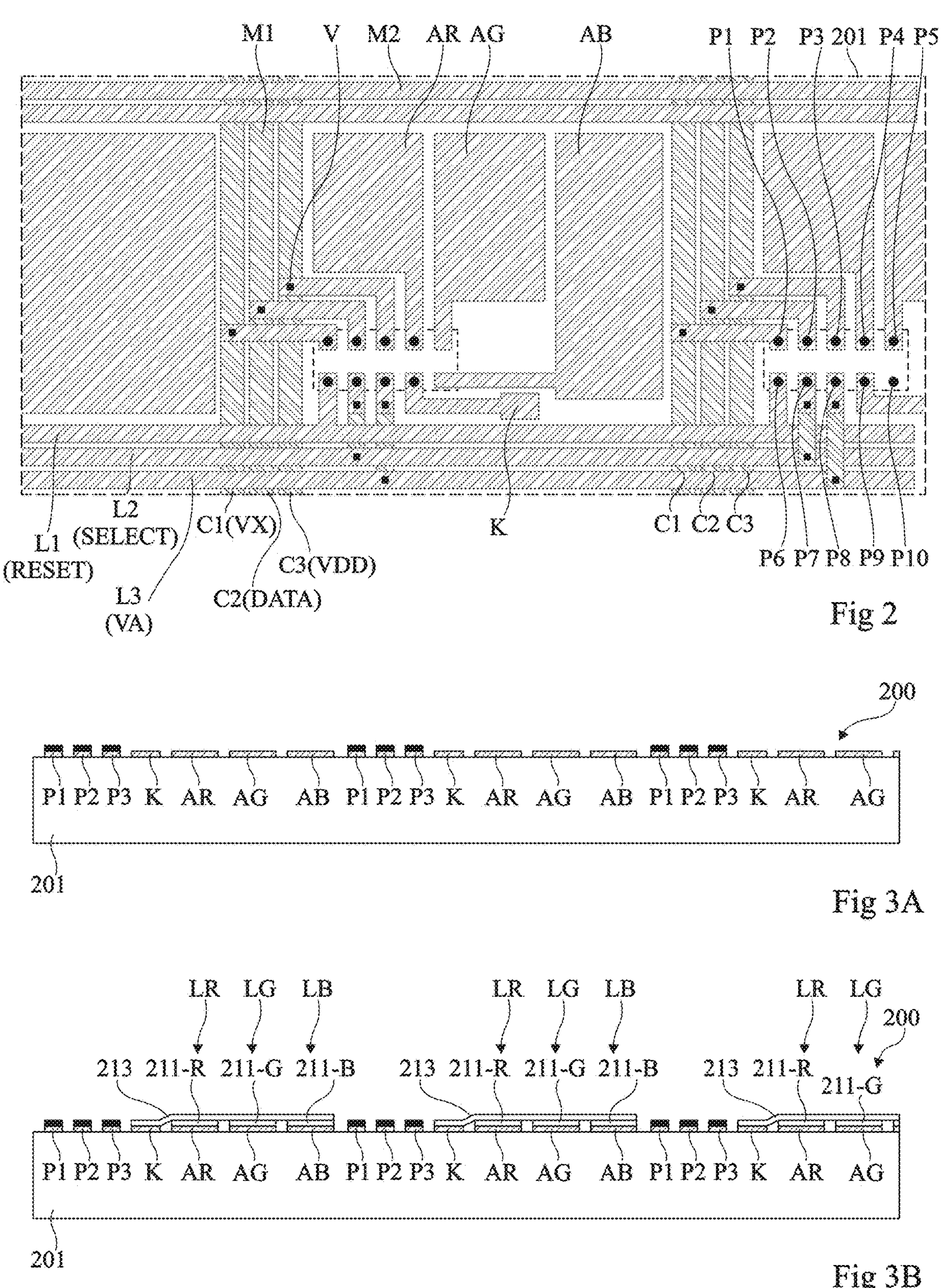
FIG. 2 is a top view schematically and partially illustrating an example of a transfer substrate of a combined image capture device according to an embodiment.
FIGS. 3A, 3B, 3C, and 3D are cross-section views illustrating successive steps of an example of a method of manufacturing a combined image capture device according to an embodiment.

FIG. 2 is a partial simplified top view of an example of embodiment of the transfer substrate 200 of the display device.

In FIG. 2, only a portion of the transfer substrate, corresponding to two adjacent pixels of a same row of the display device, has been shown.

Transfer substrate 200 for example comprises a support plate or sheet 201 made of an insulating material, for example, of glass or of plastic. As a variant, support plate or sheet 201 comprises a conductive support, for example, metallic, covered with a layer of an insulating material. The transfer substrate further comprises electric connection elements, and in particular conductive tracks and conductive areas, formed on the upper surface of support plate 201. The electric connection elements are for example formed by printing of a succession of conductive and insulating levels on the upper surface of support plate 201. The electric connection elements are for example formed by a printing method of inkjet deposition or printing type, by silk-screening, by rotogravure, or by any other adapted method.

In the shown example, transfer substrate 201 comprises two conductive metal levels M1 and M2 separated by an insulating level (not shown in the drawing), and metal vias V connecting the two metal levels through the insulating level. In this example, transfer substrate 201 further comprises metal connection areas formed on upper metal level M2, intended to be connected to corresponding connection areas 143 of the elementary pixel chips 153 of the device.

Active control circuits of the display device, adapted to powering and controlling the elementary chips of the device via the electric connection elements of the transfer substrate, are for example connected to the electric connection elements of the transfer substrate at the periphery of transfer substrate 200.

In the shown example, the manufacturing of the transfer substrate comprises the three following successive steps.

During a first deposition step, there is formed on the upper surface of support plate 201 a plurality of conductive tracks substantially parallel to the column direction of the display device (vertical direction in the orientation of FIG. 2). More particularly, in this example, during the first deposition step, there are formed, for each column of the display device, three conductive tracks C1, C2, and C3 extending along substantially the entire length of the columns of the display device. Tracks C1 are intended to convey a signal VX representative of the light intensity received by the photodetectors of the elementary chips 153 in the column. Tracks C2 are intended to convey a signal DATA for setting the light intensity emitted by the LEDs of the pixels in the column. Tracks C3 are intended to distribute a high power supply potential VDD to the different elementary pixel chips 153.

The conductive elements formed during this first deposition step define the first conductive level M1 of the transfer substrate.

During a second deposition step, the first conductor is covered with an insulating material (not shown in the drawing), to allow the subsequent deposition of conductive tracks extending above tracks C1, C2, and C3, without creating a short-circuit with tracks C1, C2, and C3.

During a third deposition step, there are formed on the upper surface of support plate 201 a plurality of conductive tracks substantially parallel to the row direction of the display device. More particularly, in this example, during the third deposition step, there are printed, for each row of the display device, three conductive tracks L1, L2, and L3 extending along substantially the entire length of the rows of the display device. Tracks L1 are intended to convey a signal RESET for controlling the resetting of the photodetectors of the corresponding pixel row. Tracks L2 are intended to convey a signal SELECT for selecting the photodetectors and/or the LEDs of the corresponding pixel row. Tracks L3 are intended to distribute a fixed bias potential VA, for example, smaller than potential VDD, to the different elementary pixel chips 153.

In this example, the device which is desired to be formed comprises, for each elementary pixel chip 153, three organic LEDs LR, LG, LB respectively defining a red light emission sub-pixel, a green light emission sub-pixel, and a blue light emission sub-pixel of the device.

In this example, during the third deposition step, are further printed, for each pixel of the device, three metal regions AR, AG, AB defining the respective anode electrodes of the organic LEDs LR, LG, LB of the pixel. Further, in this example, during the third deposition step, is further printed, for each pixel of the device, a metal region K defining a cathode contacting area common to the organic LEDs LR, LG, LB of the pixel.

The conductive elements printed during this third deposition step define the second conductive level M2 of the transfer substrate.

After the third deposition step, there are formed, for each pixel, on conductive areas of metal level M2, ten metal areas P1, P2, P3, P4, P5, P6, P7, P8, P9, and P10 intended to respectively receive ten distinct connection areas 143 of the elementary chip 153 of the pixel. Areas P1, P2, P3 are respectively connected to the conductive tracks C1, C2, and C3 of the corresponding pixel column. Areas P4 and P5 are respectively connected to the electrodes AR and AG of the pixel. Areas P6, P7, P8 are respectively connected to the conductive tracks L1, L2, L3 of the corresponding pixel row. Areas P9 and P10 are respectively connected to the electrodes K and AB of the pixel.

The vias V coupling lower and upper metal levels M1 and M2 are opened in the insulating level separating levels M1 and M2, before the forming of upper level M2.

FIGS. 3A to 3D are cross-section views illustrating successive steps of an example of a method of manufacturing a combined image capture device.

For simplification, in FIGS. 3A to 3D, elementary chips 153 and transfer substrate 200 have been very schematically shown, and many elements have been omitted with respect to the representations of FIGS. 1J and 2.

FIGS. 3A and 3B more particularly illustrate a step of forming of the organic LEDs LR, LG, LB of the pixels of the device.

FIG. 3A shows in simplified fashion the support substrate 200 of FIG. 2.

FIG. 3B illustrates the structure obtained at the end of steps of deposition of organic emissive active semiconductor layers 211-R, 211-G, 211-B respectively on top of and in contact with the anode electrodes AR, AG, AB of each pixel, and of deposition of a common upper electrode 213 on top of and in contact with active layers 211-R, 211-G, 211-B.

Active layers 211-R, 211-G, 211-B are successively deposited, locally, respectively on the electrodes AR, AG, AB of each pixel, for example, by evaporation through a shadow mask. As a variant, active layers 211-R, 211-G, 211-B are successively deposited by a local printing method, for example, by inkjet printing, by silk screening, or by a slot-die coating. In each emission sub-pixel, the portion of active organic layer 211-R, 211-G, 211-B of the sub-pixel for example extends over the entire upper surface of the corresponding electrode AR, respectively AG, respectively AB. Active layers 211-R, 211-G, and 211-B are for example adapted to mainly emitting respectively red light, green light, and blue light, and optionally an infrared radiation.

Upper electrode layer 213 continuously extends on top of and in contact with the upper surface of active layers 211-R, 211-G, 211-B. Upper electrode layer 213 further extends on top of and in contact with the upper surface of the metal cathode contacting region K common to LEDs LR, LG, LB. Upper electrode layer 213 is transparent to the emission wavelengths of LEDs LR, LG, LB. As an example, upper electrode layer 213 is made of a transparent conductive oxide, for example, of indium-tin oxide (ITO). Upper electrode layer 213 may be locally deposited, for each pixel, above active layers 211-R, 211-G, 211-B and the metal region K of the pixel, for example, by evaporation through a shadow mask. In particular, layer 213 does not extend above metal areas P1, P2, P3, P4, P5, P6, P7, P8, P9, P10 or above conductive tracks L1, L2, L3 to avoid shorting these elements.

At the end of these steps, organic LEDs LR, LG, LB are formed. LED LR is formed by the stacking of layers AR, 211-R, and 213. LED LG is formed by the stacking of layers AG, 211-G, and 213. LED LB is formed by the stacking of layers AB, 211-B, and 213.

After the deposition of upper electrode layer 213, a transparent insulating encapsulation layer, not shown, is preferably deposited over the upper surface of the organic LEDs. The protection layer is for example made of alumina ($Al_2O_3$) or of silicon oxide. In this example, the encapsulation layer does not cover contact metal areas P1, P2, P3, P4, P5, P6, P7, P8, P9, P10 to allow the subsequent connection of the elementary chips 153 on these areas.

Figure 3C:
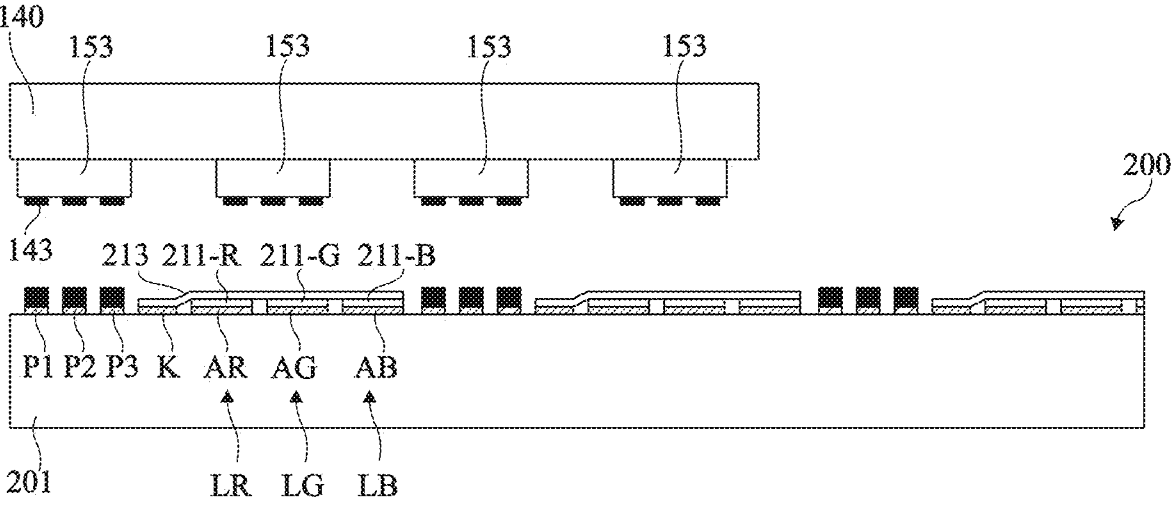
Figure 3D:
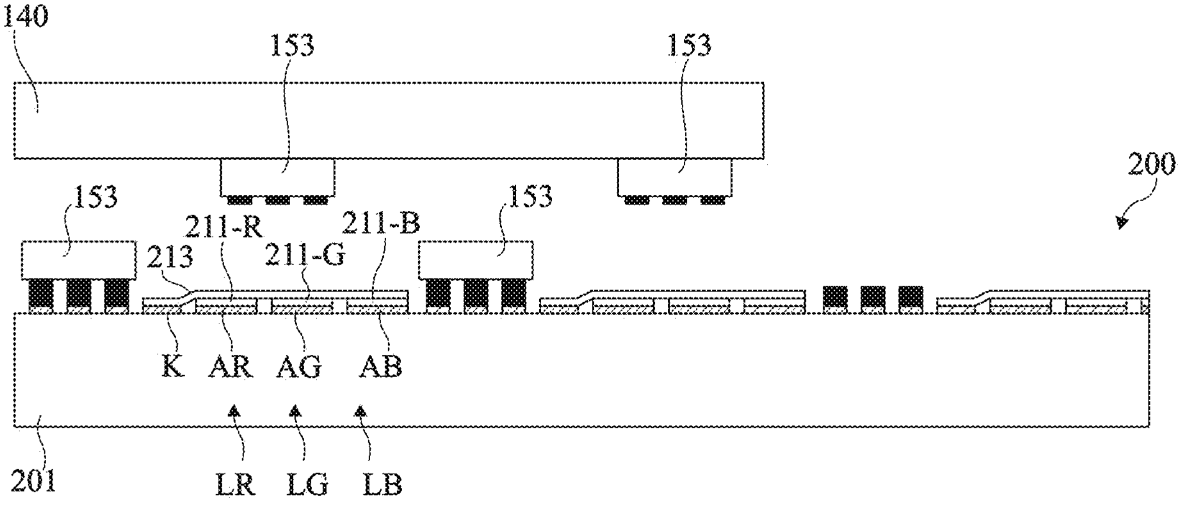

FIGS. 3C and 3D more particularly illustrate a step of collective transfer of elementary pixel chips 153 onto transfer substrate 200.

Elementary chips 153 are initially bonded to a surface of temporary support substrate 140. The structure comprising temporary support substrate 140 and elementary chips 153 is for example formed by a method of the type described in relation with FIGS. 1A to 1J. In the shown example, the structure is flipped with respect to the orientation of FIG. 1J, that is, elementary chips 153 are arranged on the lower surface side of temporary support substrate 140.

Elementary chips 153 are collectively transferred in front of the connection surface of transfer substrate 200, that is, its upper surface in the orientation of FIGS. 3C and 3D, by using temporary support substrate 140 as a handle (FIG. 3C).

The connection terminals 143 of elementary chips 153, located on the side of the lower surface of said chips, are then placed into contact with the corresponding connection areas P1, P2, P3, P4, P5, P6, P7, P8, P9, P10 of transfer substrate 200 and bonded to said connection areas P1, P2, P3, P4, P5, P6, P7, P8, P9, P10. The bonding of the connection terminals 143 of elementary chips 153 to the connection areas of the transfer substrate is for example performed by direct bonding, by thermocompression, by soldering, by means of metal microstructures (for example, micropillars) previously formed on terminals 143, or by any other adapted bonding and connection method.

Once bonded, by their connection terminals 143, to transfer substrate 200, elementary chips 153 are separated from temporary support substrate 140 and the latter is removed (FIG. 3D), clearing the access to the illumination surface of photodetectors D1 (not detailed in FIGS. 3C and 3D).

The pitch of the elementary chips 153 on transfer substrate 200 may be greater than the pitch of the elementary microchips 153 on temporary transfer substrate 140. Preferably, the pitch of the elementary chips 153 on transfer substrate 200 is a multiple of the pitch of the elementary microchips 153 on temporary support substrate 140. In this case, only part of chips 153 is sampled from support substrate 140 at each transfer, as illustrated in FIGS. 3C and 3D. The other chips 153 remain fastened to temporary support substrate 140 and may be used during another step of collective transfer to populate another portion of transfer substrate 200 or another transfer substrate.

In this example, organic LEDs LR, LG, LB are formed before the transfer of elementary chips 153 onto transfer substrate 200. As a variant, organic LEDs LR, LG, LB made by formed after the transfer of elementary chips 153 onto substrate 200. In this case, the encapsulation layer of the organic LEDs may continuously extend over the entire upper surface of the device, that is, not only on the organic LEDs but also on the upper surface and on the sides of elementary chips 153.

Optical systems (for example, lenses for focusing the captured image) may be added on the capture devices.

Figure 4:
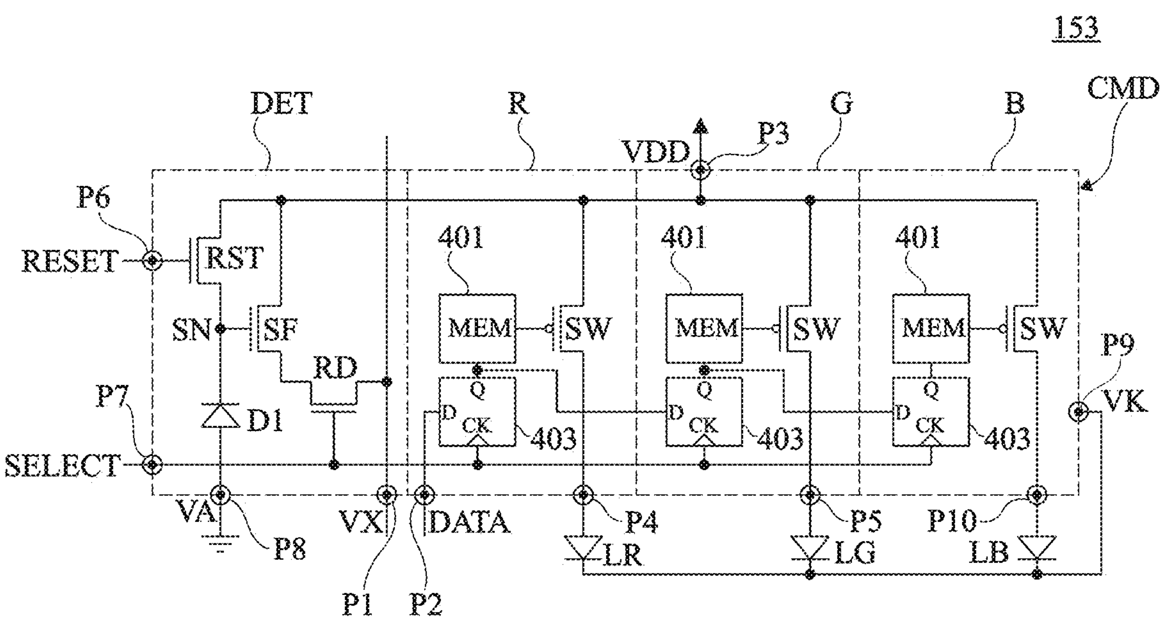
FIG. 4 is an electric diagram of an example of an elementary pixel chip of a combined image capture device according to an embodiment.

FIG. 4 is an electric diagram of the circuits of an example of an elementary pixel chip 153 of a combined capture device of the above-described type.

In this example, chip 153 is a chip 10 with 10 terminals or connection pads 143 respectively connected to the ten connection areas P1, P2, P3, P4, P5, P6, P7, P8, P9, and P10 of the support substrate 200 of FIG. 2.

The chip 153 of FIG. 4 comprises a detection pixel DET adapted to measuring an intensity of a light radiation received by the chip, for example, an infrared radiation. Detection pixel DET comprises photodetector D1, and a circuit for reading a signal representative of a light intensity received by photodetector D1. Chip 153 further comprises a circuit CMD for controlling organic LEDs LR, LG, LB defining the emission sub-pixels associated with the chip. More particular, control circuit CMD comprises three elementary control circuits R, G, and B adapted to respectively controlling LEDs LR, LG, and LB.

In this example, each of control sub-circuits R, G, and B comprises a MOS transistor SW having a first conduction node coupled, for example, connected, to terminal P3 of application of high power supply potential VDD, and a second conductive node coupled, for example, connected, to the anode terminal P4, respectively P5, respectively P10 of the corresponding LED LR, respectively LG, respectively LB. In this example, transistors SW are P-channel MOS transistors, each transistor SW having its source coupled, for example, connected, to terminal P3 and its drain coupled, for example, connected, to the anode of the LED 123 of the sub-pixel.

The cathodes of LEDs LR, LG, LB may be connected to terminal P9 of the chip, delivering a fixed bias potential VK, lower than potential VDD. Chip 153 may comprise a circuit, not detailed, for delivering potential VK. As a variant, terminals P8 and P9 may be coupled, the cathode potential VK of LEDs LR, LG, LB then being equal to the anode potential VA of photosensitive diode D1. In another variant, terminal P9 may be omitted, potential VK being distributed on the pixel metallizations K via column or row conductive tracks formed in the metallization level M1 or M2 of transfer substrate 200.

In this example, LEDs LR, LG, LB are controlled by means of binary coding digital instruction signals, for example, according to a control method of PWM ("Pulse Width Modulation") type, for example of the type described in patent application EP3079142 previously filed by the applicant. Each of control sub-circuits R, G, and B comprises a memory circuit 401 (MEM), for example a SRAM ("Static Random Access Memory") memory or a D-type flip-flop, adapted to storing a series of binary values (0 or 1) respectively defining an off or on state of transistor SW, and thus an off or on state of the associated LED LR, respectively LG, respectively LB. As a variant, memory circuit 401 may comprise a simple switch and a low-leakage capacitive element. Each memory circuit comprises an output node coupled, for example, connected, to a control node (gate) of transistor SW. In this example, each of control sub-circuits R, G, and B further comprises a D flip-flop 403 having a data input node D, a data output node Q coupled, for example, connected, to an input node of the memory circuit 401 of the sub-circuit, and a control node CK coupled, for example connected, to terminal P7 of application of control signal SELECT. In this example, the flip-flops 403 of the chip sub-circuits R, G, and B are series-coupled. More particularly, in the shown example, the flip-flop 403 of control sub-circuit R has its data input node D coupled, for example connected, to terminal P2 of application of emission data signal DATA, the flip-flop 403 of control sub-circuit G has its data input node D coupled, for example, connected to the output node Q of the flip-flop 403 of control sub-circuit R, and the flip-flop 403 of control sub-circuit B has its data input node D coupled, for example connected, to the output node Q of the flip-flop 403 of control sub-circuit G.

In this example, the circuit READ for reading from detection pixel DET comprises three N-channel MOS transistors RST, SF, and RD. Transistor RST has its drain coupled, for example, connected, to terminal P3 of application of high power supply potential VDD and its source coupled, for example, connected, to the cathode of photodetector D1. In this example, the gate of transistor RST is connected to the terminal P6 of application of the pixel reset signal RESET. Transistor SF has its drain coupled, for example connected, to terminal P3 and its source coupled, for example, connected, to the drain of transistor RD. Transistor SF has its gate coupled, for example connected, to the source of transistor RST. Transistor RD has its source coupled, for example, connected, to terminal P1 for delivering the output signal VX of the photodetector. The gate of transistor RD is coupled, for example, connected, to terminal P7 of application of control signal SELECT.

Figure 5:
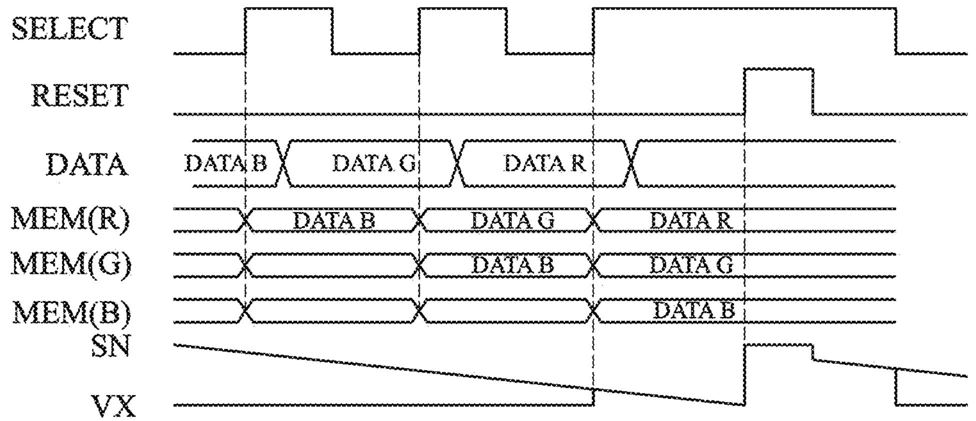
FIG. 5 is a diagram schematically illustrating the operation of the elementary pixel chip of FIG. 4.

FIG. 5 is a diagram schematically illustrating the operation of the elementary pixel chip 153 of FIG. 4. FIG. 5 more particularly shows the time variation of signals SELECT, RESET, DATA, VX, as well as of the potential SN of the gate node of transistor SF, and of the signals MEM(R), MEM(G) and MEM(B) respectively contained in the memories MEM of control sub-circuits R, G, and B.

In this example, the respective emission instruction signals DATA R, DATA G, and DATA B of LEDs LR, LG, and LB are digital signals temporally multiplexed on terminal P2 (signal DATA). At each rising edge of signal SELECT, an emission data bit of signal DATA is transmitted from terminal P2 to the memory 401 of control sub-circuit R, the previous data bit is transmitted from the output terminal Q of the D flip-flop 403 of control sub-circuit R to the memory 401 of control sub-circuit G, and the previous data bit is transmitted from the output terminal Q of the D flip-flop 403 of control sub-circuit G to the memory 401 of control sub-circuit B. Thus, three periods of signal SELECT are necessary to transmit three instruction signals respectively to the three control sub-circuits R, G, and B of the device.

In this example, signal RESET enables to control the reset transistor RST of the circuit for reading from detection pixel DET. This enables, at each reading, to sample a first value of signal VX at the end of an integration period during which reset transistor RST is maintained off, and then a second value of signal VX immediately after a reset period of photodetector D1 during which reset transistor D1 is maintained on (the end of the reset period marking the beginning of a second integration period). The difference between the two read values defines the output value of the pixel. A double-sampling reading is thus performed.

Figure 6:
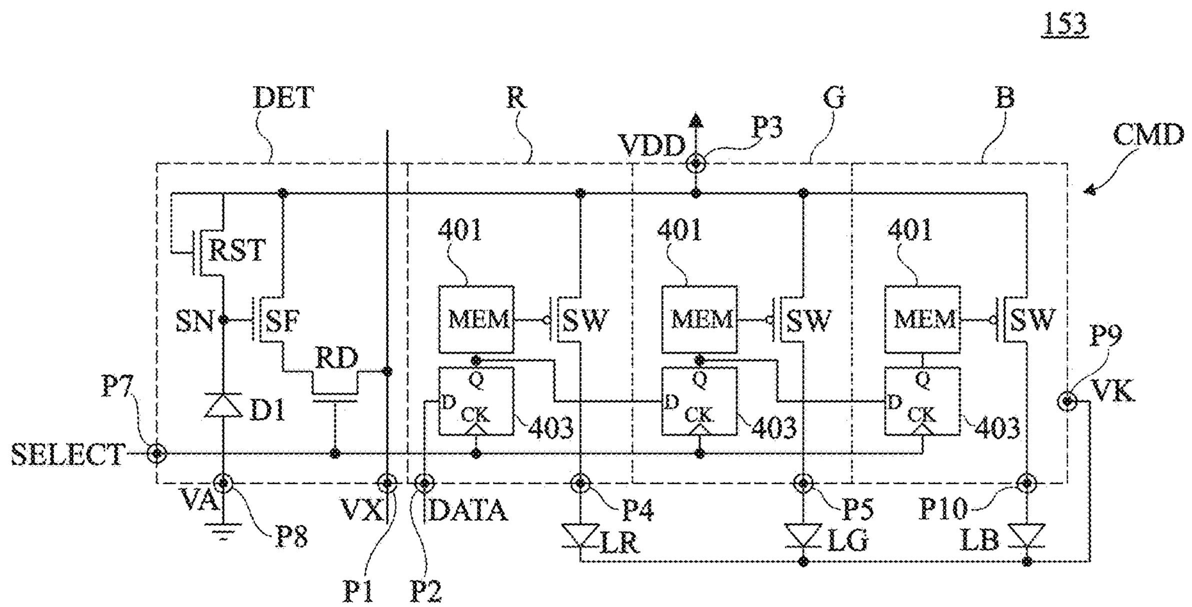
FIG. 6 is an electric diagram of the circuits of another example of an elementary pixel chip of a combined image capture device according to an embodiment.

FIG. 6 is an electric diagram of the circuits of an example of an elementary pixel chip 153 of an interactive display device of the above-described type.

The elementary chip 153 of FIG. 6 differs from the elementary chip 153 of FIG. 4 essentially in that it does not comprise the terminal P6 of application of reset signal RESET.

In the example of FIG. 6, the gate of transistor RST is connected to the drain of this same transistor. In other words, transistor RST is diode-assembled.

Figure 7:
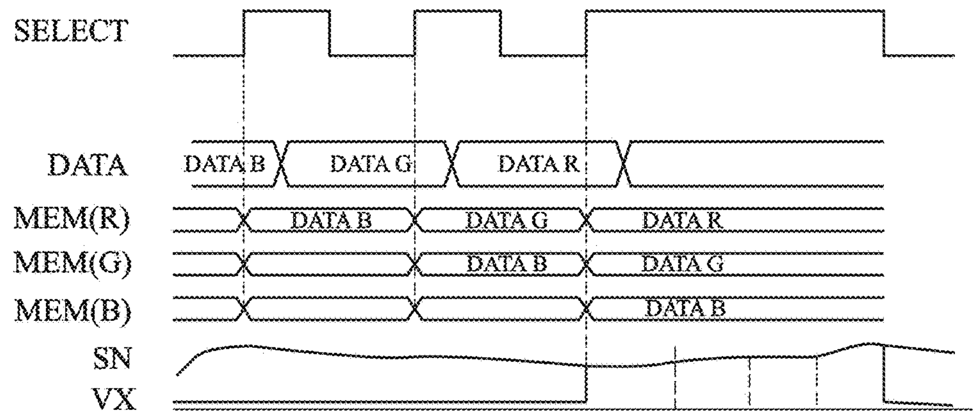
FIG. 7 is a diagram schematically illustrating the operation of the elementary pixel chip of FIG. 6.

FIG. 7 is a diagram schematically illustrating the operation of the elementary pixel chip 153 of FIG. 6. FIG. 7 more particularly shows the time variation of signals SELECT, DATA, VX, as well as of the potential SN of the gate node of transistor SF, and of the signals MEM(R), MEM(G), and MEM(B) respectively contained in the memories MEM of control sub-circuits R, G, and B.

The diode configuration of transistor RST operating in low inversion rate implies a logarithmic response of the voltage on its source according to the current which crosses its channel, in this case the photocurrent generated by photodiode D1. Thus, the circuit for reading from detection pixel DET implements a logarithmic reading of the photocurrent generated by photodetector D1. At each period of activation of signal SELECT, transistor RD is turned on. The signal VX delivered on output terminal P1 is then an analog voltage representative of the instantaneous luminosity received by the photodetector D1 of the pixel. Signal VX may be read and digitized at the foot of a column. As an example, at each update of the emission instruction signals of the control sub-circuits R, G, and B of the chip, the signal VX of the pixel may be successively read three times and an average of the three values may be performed, to minimize the readout noise.

Various embodiments and variants have been described. Those skilled in the art will understand that certain features of these various embodiments and variants may be combined, and other variants will occur to those skilled in the art. In particular, the described embodiments are not limited to the specific examples of embodiment of the elementary pixel chips and of the transfer substrate described in relation with FIGS. 1A to 1J, 2, and 3A to 3D.

Further, the described embodiments are not limited to the specific examples of embodiment of the electronic control circuits (control of the LED light emission or of the actuation element or reading from the capture or actuation element) of the elementary pixel chips described in relation with FIGS. 4 to 7.

Further, the described embodiments are not limited to the specific case described hereabove, where the LEDs of the device are organic LEDs. As a variant, the organic LEDs of the described device may be replaced with inorganic LEDs, for example, based on III-V-type semiconductor materials, for example, based on gallium nitride.

More generally, the LEDs may be replaced, totally or partly, with any other capture or actuation element external to chips 153. These capture or actuation elements may be of any type. A non-limiting example of such elements may be, for example, ultrasound or acoustic transducers, for example of piezoelectric type. This for example enables to implement functions of touch or proximity detection of an object, for example, a user's hand, for example, by using the direct piezoelectric effect, and/or haptic stimulation functions, and/or functions of emission of directional acoustic waves, for example by using the indirect piezoelectric effect.

Thus, by actuation function, there is for example meant the actuation of piezoelectric actuators to generate an ultrasound wave or a vibration mode capable of causing a significant haptic effect to the user.

As an example, all or part of the photodetectors may be replaced with piezoelectric actuators, each comprising a stack:

of a lower electrode, for example, metallic, for example, made of silver, of molybdenum, of platinum, of gold, or of an alloy of one or a plurality of these materials, of a layer of a piezoelectric material, for example, lead zirconate titanium (PZT), aluminum nitride (AlN), or any other piezoelectric material, and of an upper electrode, for example, metallic, for example, made of silver, of molybdenum, of platinum, of ruthenium, of gold, or of an alloy of one or a plurality of these materials.

The application of an electric field between the upper electrode and the lower electrode induces a deformation of the piezoelectric material. According to the sent signal, for example, sinusoidal at a frequency defined as being the sized work frequency, the actuator generates an ultrasound wave or a vibration mode (for example, of flexural mode type, or an asymmetrical Lamb mode), for example, capable of generating a haptic effect. This effect may result from a variation of the friction coefficient, particularly if the generated vibration mode is a Lamb mode.

The electronic circuits for controlling elementary chips 153 are then replaced with electronic circuits for controlling the capture or actuation elements, for example, circuits for controlling the ultrasound transducers in transmission and/or in reception.

As a variant, the capture or action elements external to chips 153 may be photodetectors of different nature than photodetectors D1, for example, organic photodetectors. The electronic circuits for controlling elementary chips 153 then comprise circuits for reading from the external photodetectors.

Finally, the practical implementation of the described embodiments and variations is within the abilities of those skilled in the art based on the functional indications given hereabove.

The invention claimed is:

1. Device comprising:

a transfer substrate comprising electric connection elements; and a plurality of elementary chips bonded and electrically connected to the transfer substrate, each elementary chip comprising at least one photodetector and an electronic circuit for reading from said at least one photodetector, the elementary chips being arranged in an array of rows and columns defining a pixilated image capture device, each elementary chip corresponding to a pixel of the image capture device, the device further comprising, associated with at least one elementary chip of the plurality of elementary chips, an emission, capture, or actuation element external to the elementary chip, bonded and electrically connected to the transfer substrate, each elementary chip comprising an electronic circuit for controlling the emission, capture, or actuation element associated with the chip, wherein, in each column of the array, the elementary chips of the column are connected to at least one column conductive track common to the elementary chips of the column, and, in each row of the array, the elementary chips of the row are connected to at least one row conductive track common to the elementary chips of the row.

2. Device according to claim 1, wherein, in each elementary chip, the electronic circuit for reading from said at least one photodetector and the electronic circuit for controlling the emission, capture, or actuation element associated with the chip comprise MOS transistors formed inside and on top of a single-crystal silicon layer.

3. Device according to claim 1, wherein, in each elementary chip, said at least one photodetector is an inorganic photodetector based on a III-V semiconductor material.

4. Device according to claim 3, wherein, in each elementary chip, said at least one photodetector comprises an indium gallium arsenide absorption layer.

5. Device according to claim 1, wherein the emission, capture, or actuation element comprises at least one light-emitting diode.

6. Device according to claim 5, wherein said at least one light-emitting diode is an organic light-emitting diode.

7. Device according to claim 5, wherein each emission, capture, or actuation element comprises three light-emitting diodes respectively defining three emission sub-pixels, and wherein each elementary chip comprises a plurality of control sub-circuits adapted to individually controlling respectively the three light-emitting diodes.

8. Device according to claim 7, wherein the three emission sub-pixels are adapted to respectively emitting in three different wavelength ranges.

9. Device according to claim 7, wherein, in each elementary chip, the three control sub-circuits are coupled to a same input terminal of the chip, connected to a corresponding connection area of the transfer substrate, intended to sequentially receive emission instruction signals for the three light emitting diodes.

10. Device according to claim 1, wherein the capture or actuation element associated with each elementary chip is a piezoelectric transducer.

11. Device according to claim 1, wherein active power and control circuits are connected to the at least one row conductive track and the at least one column conductive track at a periphery of the transfer substrate.

* * * * *